(12) United States Patent
Rahimian et al.

(10) Patent No.: US 11,287,479 B2
(45) Date of Patent: Mar. 29, 2022

(54) CONTROL-ORIENTED PHYSICS-BASED CALENDAR LIFE MODEL FOR LITHIUM ION CELLS

(71) Applicant: CHONGQING JINKANG POWERTRAIN NEW ENERGY CO., LTD., Chongqing (CN)

(72) Inventors: Saeed Khaleghi Rahimian, San Jose, CA (US); Junzhe Shi, Santa Clara, CA (US); Wenke Zhang, Santa Clara, CA (US); Ying Liu, Santa Clara, CA (US); Mehdi Forouzan, Santa Clara, CA (US); Yifan Tang, Santa Clara, CA (US)

(73) Assignee: CHONGQING JINKANG POWERTRAIN NEW ENERGY CO., LTD., Chongqing (CN)

( * ) Notice: Subject to any disclaimer, the term of this patent is extended or adjusted under 35 U.S.C. 154(b) by 257 days.

(21) Appl. No.: 16/520,192

(22) Filed: Jul. 23, 2019

(65) Prior Publication Data

US 2021/0025942 A1    Jan. 28, 2021

(51) Int. Cl.
*G01R 31/36* (2020.01)
*G01R 31/392* (2019.01)
*G01R 31/385* (2019.01)
*H01M 10/052* (2010.01)

(52) U.S. Cl.
CPC ....... *G01R 31/3648* (2013.01); *G01R 31/385* (2019.01); *G01R 31/392* (2019.01); *H01M 10/052* (2013.01)

(58) Field of Classification Search
CPC .............. G01R 31/3648; G01R 31/392; G01R 31/385; G01R 31/374; G01R 31/389; H01M 10/052; H01M 10/48; H01M 10/486; H01M 2010/4271; H01M 10/425; Y02E 60/10
USPC ........................................................ 320/132
See application file for complete search history.

(56) References Cited

U.S. PATENT DOCUMENTS

| 9,902,277  | B2 * | 2/2018  | Keller ................... H02J 7/0014 |
| 10,305,309 | B2 * | 5/2019  | Baumgartner .......... H02J 7/007 |
| 10,416,241 | B2 * | 9/2019  | Matsumura .............. G01K 1/00 |
| 10,481,623 | B1 * | 11/2019 | Forouzan .............. H01M 10/66 |
| 10,502,791 | B1 * | 12/2019 | Li .......................... G01R 31/367 |
| 10,569,660 | B2 * | 2/2020  | Lee .......................... B60L 58/24 |

(Continued)

OTHER PUBLICATIONS

Ghanim et al., (Ghanim),Analysis of Thermal Degradation of Batteries to Aid Temperature Control and Optimise Life, Dec. 11-14, 2017; Conference Paper, IEEE (Year: 2017).*

(Continued)

*Primary Examiner* — M Baye Diao
(74) *Attorney, Agent, or Firm* — Cooper Legal Group, LLC (57) ABSTRACT

A physics-based calendar life model for determining the state of health of a lithium ion battery cell. The model accounts for parasitic reactions on anode and cathode particles to accurately determine degradation of a battery. By incorporating electrolyte decomposition in a cathode, the present calendar model can predict capacity retention as well as the substantial rise of cell resistance at high state of charge (SOC) and temperatures. The present calendar model is a simple algorithm, utilizing only three parameters, and determines the capacity retention and resistance rise based on temperature, SOC and time.

20 Claims, 8 Drawing Sheets

(56) References Cited

U.S. PATENT DOCUMENTS

| | | | |
|---|---|---|---|
| 11,038,214 B2* | 6/2021 | Rahimian | H01M 10/48 |
| 2011/0172939 A1* | 7/2011 | Uprety | G01R 31/392 |
| | | | 702/63 |
| 2015/0231986 A1* | 8/2015 | Li | B60L 58/20 |
| | | | 701/22 |
| 2015/0323610 A1* | 11/2015 | Ahn | H02J 7/0021 |
| | | | 320/152 |
| 2019/0296562 A1* | 9/2019 | Baumgartner | H01M 10/441 |
| 2020/0164763 A1* | 5/2020 | Holme | B60L 58/10 |

OTHER PUBLICATIONS

Iiker et al., (IIker),A Basic Battery Management System Design with IoT Feature for LiFePO4 Batteries, 2017 10th International Conference on Electrical and Electronics Engineering (ELECO), Conference Paper, IEEE, pp. 1309-1312 (Year: 2017).*

Kim et al., (Kim), Real-Time Battery Thermal Management for Electric Vehicles, Apr. 14-17, 2014, 2014 ACM/IEEE International Conference on Cyber-Physical Systems (ICCPS),IEEE (Year: 2014).*

Stanciu et al., (Stanciu), Performance degradation of thermal parameters during cycle ageing of high energy density Ni—Mn—Co based Lithium-Ion battery cells,Sep. 18-22, 2016, 2016 IEEE Energy Conversion Congress and Exposition (ECCE), Conference Paper, IEEE (Year: 2016).*

Kamyab et al., "Mixed Mode Growth Model for the Solid Electrolyte Interface (SEI)," Journal of The Electrochemical Society, 166, 2019, pp. A334-A341.

Peljo et al., "Electrochemical potential window of battery electrolytes: the HOMO-LUMO misconception," Energy & Environmental Science, 11, 2018, pp. 2306-2309.

Pinson et al., "Theory of SEI Formation in Rechargeable Batteries: Capacity Fade, Accelerated Aging and Lifetime Prediction," Journal of The Electrochemical Society, 160, 2013, pp. A243-A250.

Sarasketa-Zabala et al., "Calendar ageing analysis of a LiFePO4/graphite cell with dynamic model validations: Towards realistic lifetime predictions," Journal of Power Sources, 272, 2014, pp. 45-57.

Zou et al., "Combined State of Charge and State of Health estimation over lithium-ion battery cell cycle lifespan for electric vehicles," Journal of Power Sources, 273, 2015, pp. 793-803.

* cited by examiner

CONTROL-ORIENTED PHYSICS-BASED CALENDAR LIFE MODEL FOR LITHIUM ION CELLS

BACKGROUND

Lithium ion battery state of health (SOH) estimation is one of the most challenging and vital tasks of battery management systems in electronic vehicles. Online estimation methods for prediction of cell capacity and resistance during battery lifetime are prone to causing significant errors. As a result, off-line SOH estimations are the most popular algorithms where the off-line measured cell capacity and internal resistance under different storage and cycling conditions are used to generate calendar and cycle life models. An accurate calendar life model to estimate reliably the cell capacity fade and resistance rise under different battery state of charges and temperatures is an important part of the SOH algorithm.

SUMMARY

The present technology, roughly described, provides a physics-based calendar life model for determining the state of health of a lithium ion battery cell under rest (i.e. no charge or discharge). The present model accounts for parasitic reactions on anode and cathode particles to accurately determine degradation of a battery. By incorporating electrolyte decomposition in a cathode, the present calendar model can predict capacity retention as well as the substantial rise of cell resistance at high state of charge (SOC) and temperatures. In contrast to the present technology, previous models underestimate the resistance growth. The present calendar model is a simple algorithm, utilizing only three temperature-dependent parameters, and determines the capacity retention and resistance rise based on temperature and SOC and time.

In embodiments, a method is disclosed for determining a calendar model for a battery cell. The method may include accessing, by a battery management system in communication with a battery cell, an initial discharge capacity and resistance at a first time by a battery management system for the battery cell. The battery management system can determine a first temperature and a first state of charge for the battery cell at the first time, and may also determine a second temperature and a second state of charge for the battery cell at a second time. Based on a change in temperature for the battery cell or a change in state of charge for the battery cell, the battery management system determines a capacity drop for the battery cell based on the temperature and at least one physics-based property of the battery cell at the second time. A resistance growth is determined for the battery cell based on the temperature and at least one physics-based property of the battery cell at the second time. The calendar fade time is then determined based on the capacity drop and the resistance growth.

In embodiments, a non-transitory computer readable storage medium includes a program, the program being executable by a processor to perform a method for determining a calendar model for a battery cell. The method may include accessing an initial charge capacity and resistance at a first time by a battery management system for the battery cell. A first temperature and a first state of charge for the battery cell is determined at the first time, and a second temperature and a second state of charge is determined for the battery cell at a second time. Based on a change in temperature for the battery cell or a change in state of charge for the battery cell, a capacity drop for the battery cell is determined based on the temperature and at least one physics-based property of the battery cell at the second time. A resistance growth is determined for the battery cell based on the temperature and at least one physics-based property of the battery cell at the second time. The calendar fade time is then determined based on the capacity drop and the resistance growth.

In embodiments, a system for determining a calendar model for a battery cell includes one or more processors, memory, and a battery management system stored in memory and executable by the one or more processors. When executed, the battery management system may access an initial charge capacity and resistance at a first time by a battery management system for the battery cell, determine a first temperature and a first state of charge for the battery cell at the first time, determine a second temperature and a second state of charge for the battery cell at a second time, and based on a change in temperature for the battery cell or a change in state of charge for the battery cell, a capacity drop for the battery cell is determined based on the temperature and at least one physics-based property of the battery cell at the second time. The battery management system can determine a resistance growth for the battery cell based on the temperature and at least one physics-based property of the battery cell at the second time, and may determine a calendar fade time based on the capacity drop and the resistance growth.

DETAILED DESCRIPTION

The present technology, roughly described, provides a physics-based calendar life model for determining the state of health of a lithium ion battery cell. The present model accounts for parasitic reactions on anode and cathode particles to accurately determine degradation of a battery. By incorporating electrolyte decomposition in a cathode, the present calendar model can predict capacity retention as well as the substantial rise of cell resistance at high state of charge (SOC) and temperatures. In contrast to the present technology, previous models underestimate the resistance growth. The present calendar model is a simple algorithm, utilizing only three parameters, and determines the capacity retention and resistance rise based on temperature, SOC and time.

Calendar life models are usually built by fitting the capacity and resistance of cells stored at multiple state of charges (SOCs) and temperatures. This capacity and resistance data are measured at a certain time interval (e.g. every two weeks) by fully charging and discharging the cell and applying a short pulse at a certain SOC (e.g. 50%), respectively.

Empirical Arrhenius-type calendar models are typically used to predict the cell capacity fade and resistance growth under storage condition. Due to their empirical nature, these models are not reliable when applied out of range of the data used for finding model parameters. Hence, a large amount of storage data obtained over a long time (e.g. one year) is required to develop these models.

Previous calendar models only considered SEI formation on anode particles during storage because most common electrolytes used in Li-ion cells (e.g. $LiPF_6$ in carbonate-based solvents) are electrochemically unstable in the anode at almost the entire cell SOC range (the anode potential is below the electrolyte potential window[4] when the cell SOC is above 10%). To predict the capacity fade as well as the resistance rise, a new physics-based calendar life model was developed by including another parasitic reaction on cathode particles. It was assumed that at high SOCs (e.g. >90%) the cathode voltage is above the electrolyte potential window. Thus, the electrolyte of cells stored at high SOC and temperature undergoes decomposition. Whereas this oxidation reaction increases the cell capacity by producing $Li^+$ it can impact the cell resistance significantly due to gas generation and possibly a SEI film formation on cathode particles. By incorporating the electrolyte decomposition in cathode, the new calendar model is able to predict the substantial rise of the cell resistance at high SOCs (>90%) and temperatures (>35° C.), while the previous models underestimate the resistance growth significantly.

Figure 1:
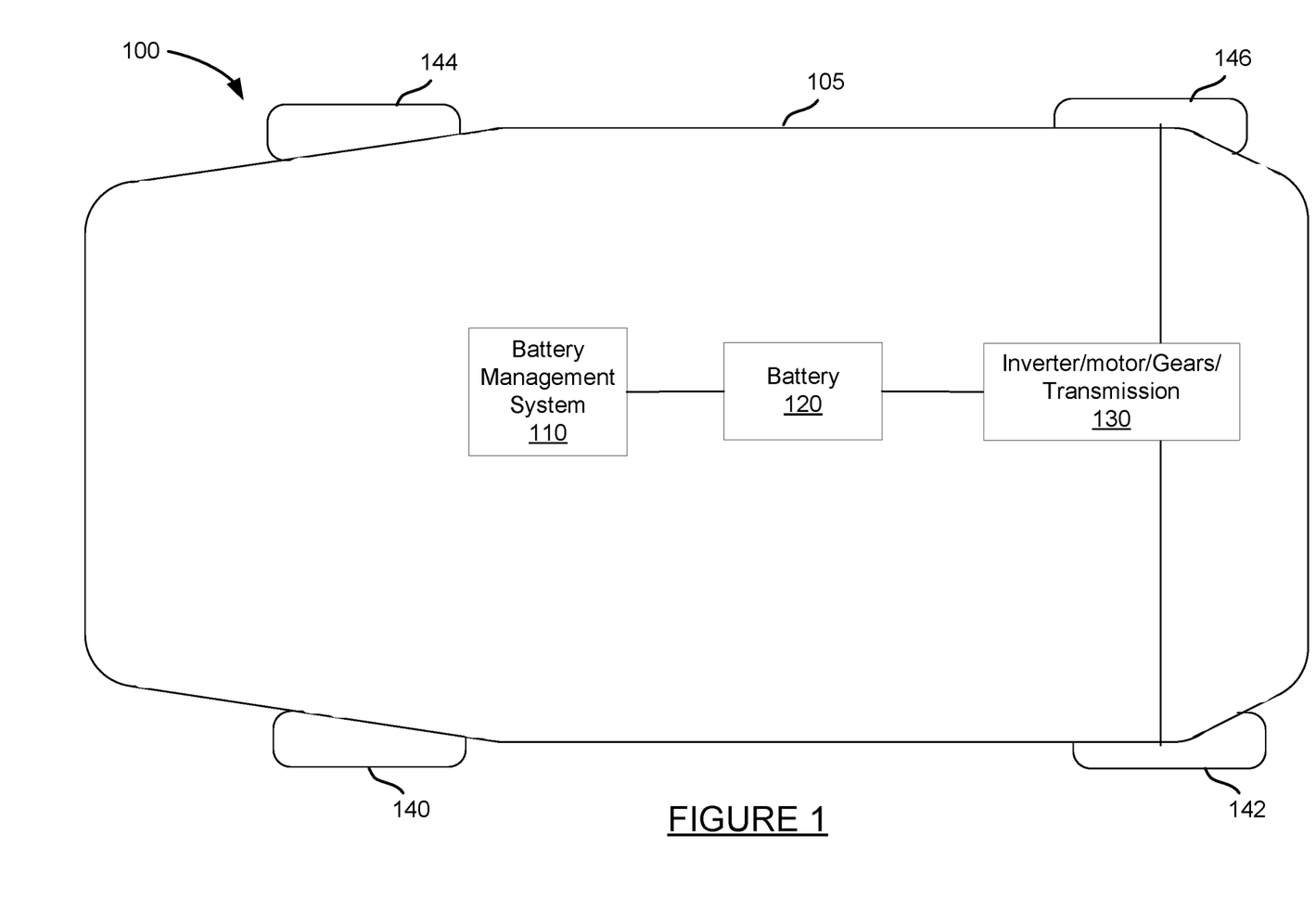
FIG. 1 is a block diagram of an electric vehicle.

The new calendar life model requires much less experimental data to be trained and can be used in a wide range of temperature and SOC and time due to its physic-based nature. On the other hand, the model includes only simple algebraic equations without demanding any iterative procedures. Thus, the new model is a perfect choice for the offline SOH estimation algorithm which can be easily implemented in BMS FIG. 1 is a block diagram of an electric vehicle. Vehicle 100 of FIG. 1 includes body 105, battery management system (BMS) 110, battery 120, drivetrain 130, and wheels 140-146. Battery management system 110 may include hardware and software that monitors and retrieves information from battery 120, controls the charging of battery 120, detects temperature and other parameters of battery 120, accesses information from local or remote data stores, and otherwise manages the battery system of electronic vehicle 100. In some instances, battery management system 110 may determine a calendar fade of battery 120. More detail for data management system 110 are discussed with respect to FIG. 2.

Battery 120 may be used to provide a charge to drive system 130. Battery 120 may communicate and be accessed by battery management system 110 and provide charge and receive charging from drivetrain 130. In some instances, battery 120 may include a lithium-ion battery.

Drivetrain 130 may include an inverter, motor, gears, transmission, and other components for converting charge provided from battery 122 to power applied to one or more of wheels 140-146.

Electronic vehicle 100 may include additional components not illustrated in FIG. 1. For example, additional components such as a data processing system and a perception module as disclosed in U.S. patent application Ser. No. 16/237,559, filed on Dec. 31, 2018, titled, "Automatic Lane Change with Lane-Biased Strategy," and U.S. patent application Ser. No. 16/412,419, filed on May 15, 2019, titled, "Energy Efficient Path Planning of Autonomous Electric Vehicle,", the disclosure of both of which is incorporated herein by reference.

Figure 2:
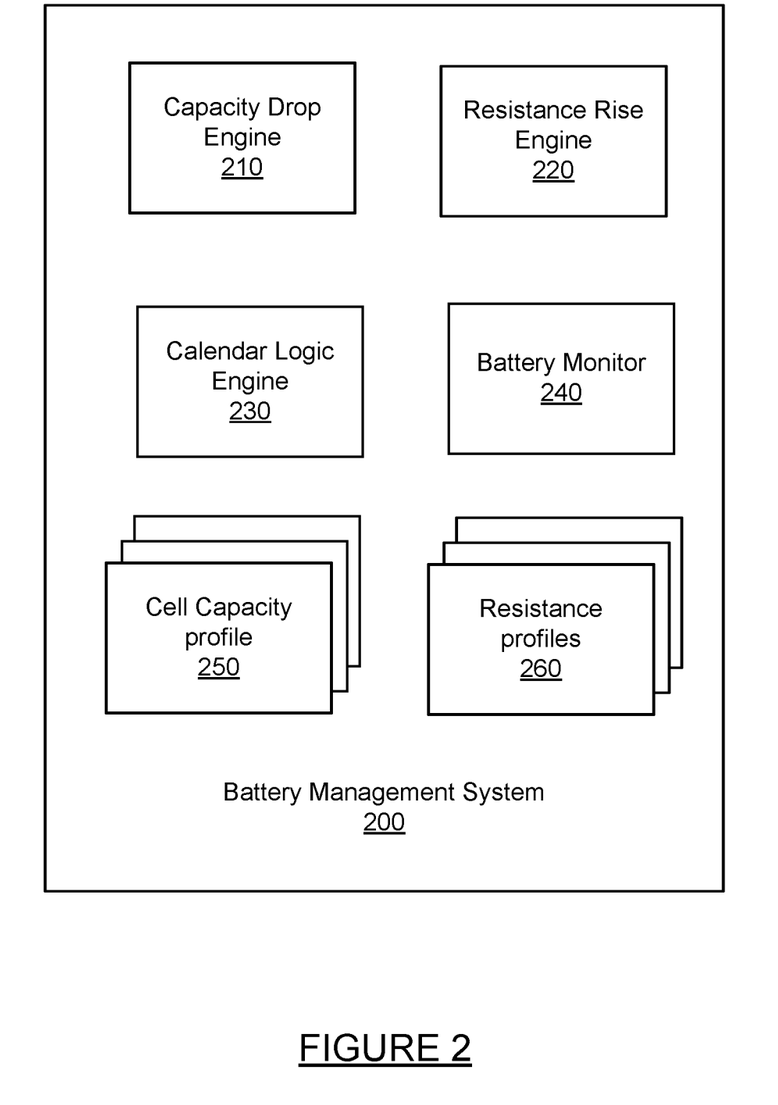
FIG. 2 is a block diagram of a battery management system.

FIG. 2 is a block diagram of a BMS. BMS of FIG. 2 provides more detail for the BMS 110 of FIG. 1. BMS 200 capacity drop engine 210, resistance rise engine 220, calendar logic engine 230, battery monitor 240, cell capacity profiles 250, and resistance profiles 260.

Capacity drop engine 210 may calculate a capacity drop for battery 120. The capacity drop may be determined based on average temperature and average state of charge (SCO) for the battery at a current time or other time.

A resistance rise engine 220 may calculate a resistance rise for the battery. In some instances, resistance rise may be calculated for a cathode and an anode based on based on various parameters, in some instances including an average temperature and an average state of charge.

A calendar logic engine 230 may determine a calendar fade based at least on the capacity drop and resistance rise for the current cell. A battery monitor 240 may determine battery parameters such as temperature, state of charge, and other parameters. Cell capacity profile module 250 may include a plurality of cell capacity data for the current cell. Resistance profiles module 260 may include a plurality of resistance data for the current cell.

While charging Li-ion cells can increase the side reaction rates in electrodes, these reactions can always occur, whether the cells are at rest or being charged or discharged. Thus, the proposed model can be used as part of the SOH algorithm in a BMS to estimate the calendar fade during rest as well as cycling operation:

rest: Total fade=Calendar fade cycling: Total fade=Calendar fade+Cycling fade

Figure 3:
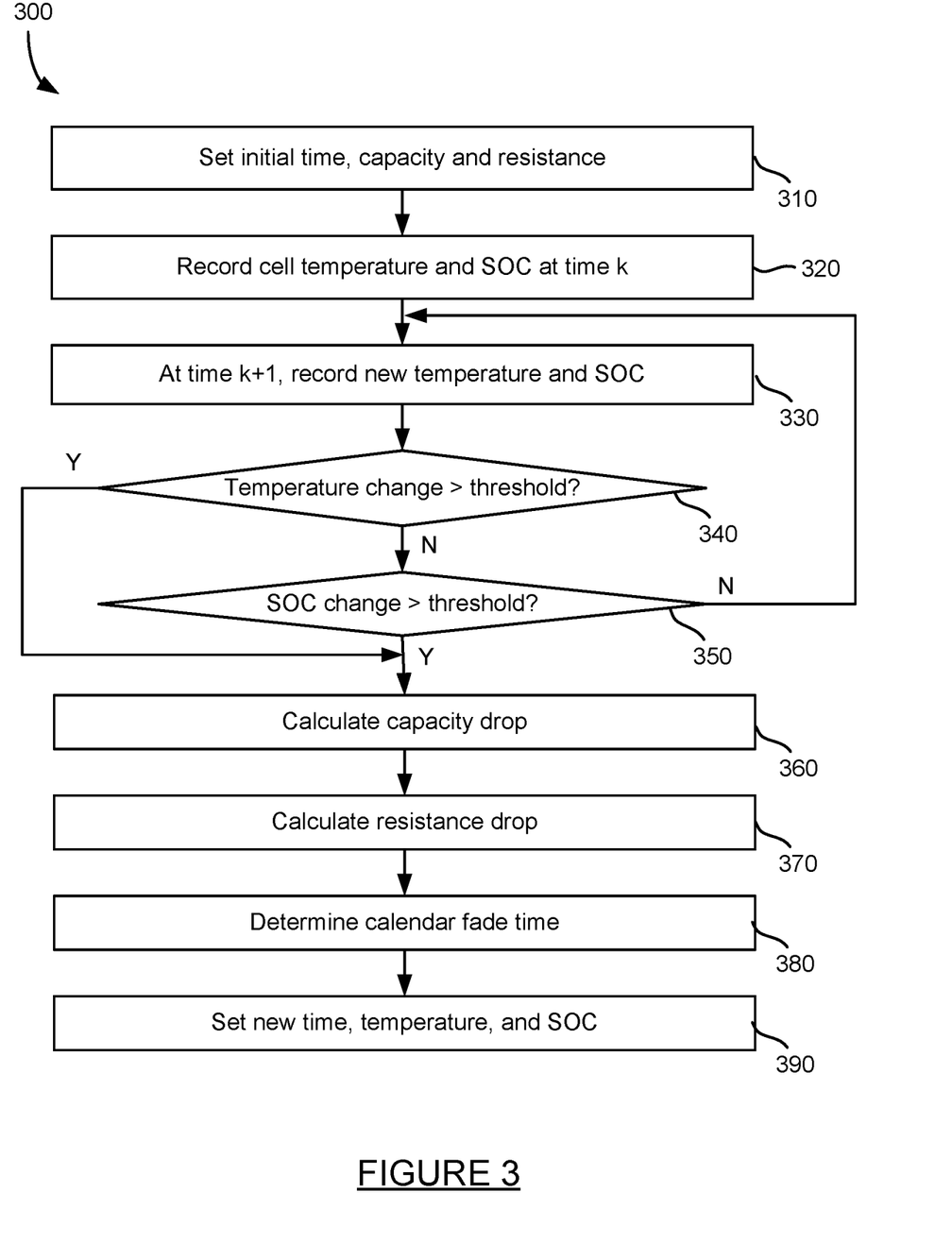
FIG. 3 is an exemplary method for determining a calendar fade.

FIG. 3 is an exemplary method for determining a calendar fade. To estimate the calendar fade to capacity drop, the procedure outlined in the method of FIG. 3 is implemented in the BMS.

An initial time, capacity, and resistance are set at step 310. The initial capacity and resistance may be determined from off-line data associated with the particular cell. The initial time may be, for example, the current time. A cell temperature and state of charge (SOC) are recorded at the time K, the initial time, at step 320. The cell temperature may be determined by the battery management system 110 for the battery 120.

At a subsequent time, such as time K+1, a new temperature and SOC are recorded at step 330. The subsequent time may be one minute later, five minutes later, 10 minutes later, an hour later, a day later, a week, a month, or some other period of time after the initial time K. In some instances, one or more of the steps of FIG. 3 are performed cyclically, and the subsequent time at step 330 is determined periodically. In some instances, the subsequent time is determined based on an event or at some time period after the initial time that may or may not be periodical.

A determination is made as to whether a change in temperature is greater than a temperature change threshold that step 340. The change in temperature is determined between the initial temperature at time K measured at step 320 and the temperature at time K+1 measured at step 330. If the difference between the initial cell temperature and the subsequent recorded temperature is greater than a threshold, the method of FIG. 3 continues to step 360. In some instances, the threshold may be 1°, 1.5°, 2°, 2½, 3°, a percentage of the initial temperature such as 0.5% or 1.0%, or some other threshold. If a temperature change is not greater than the threshold, then the method of FIG. 3 continues to step 350.

A determination is made as to whether a change in the state of charge is greater than an SOC change threshold at step 350. The SOC change threshold may be 2%, 5%, 70%, 10%, or some other change. If the change in SOC is less than a corresponding threshold at step 350, the method of FIG. 3 returns to step 330. If the SOC change is greater than the SOC change threshold at step 350, and the method of FIG. 3 continues to step 360.

A capacity drop is calculated at step 360. A capacity drop may be calculated at an average temperature and average SOC for the cell. The average temperature and average SOC can be determined from the temperature and SOC at times K and K+1, respectively. The capacity drop may be determined from physics properties of the cell such an SEI density and molecular weight, thickness, an anode surface area. More details for determining a capacity drop for a cell are discussed with respect to the method of FIG. 4.

A resistance rise is calculated at step 370. The resistance rise may be determined based on average temperature an average SOC. The average temperature may be determined from the temperature recorded at step 320 and 330. The average SOC may be also determined based on the SOC recorded at step 320 and step 330. Calculating a resistance rise main include determining an anode and cathode resistance increase based on physics properties such as an anode parameter, direct-current resistance, cathode parameter, and direct current resistance for a cathode. More detail for calculating a resistance rise is discussed with respect to the method of FIG. 5.

A calendar fade time is determined at step 380. The calendar fade time may involve matching a new capacity and determining a difference in time associated with a temperature change for a new capacity. More details for determining a new calendar fade time are discussed with respect to the method of FIG. 6.

The new time, temperature, and SOC are set at step 390. The method of FIG. 3 can then repeat iteratively, and continue from step 390 to step 330. A new calendar fade time may then be determined in the next iteration starting from step 330.

Figure 4:
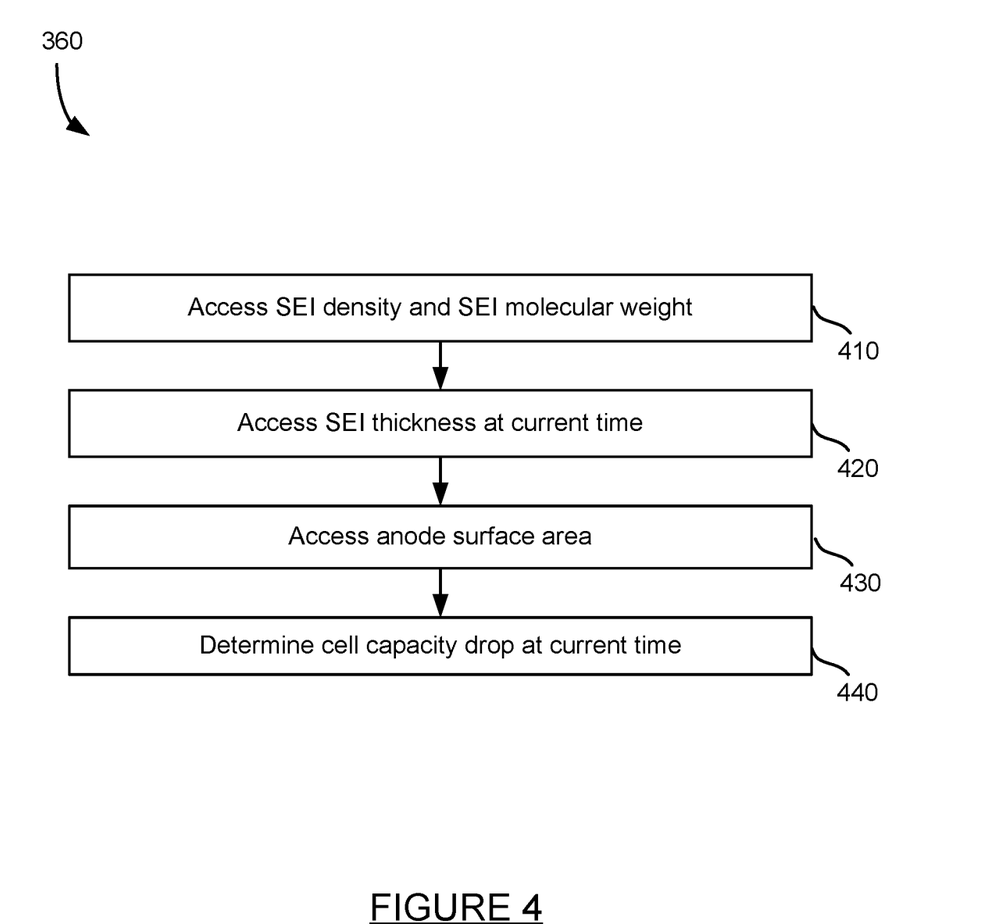
FIG. 4 is an exemplary method for calculating a capacity drop.

FIG. 4 is an exemplary method for calculating a capacity drop. The method of FIG. 4 provides more detail for step 360 of the method of FIG. 3. First, an SEI density and SEI molecular weight are accessed at step 410. An SEI thickness for a current time is accessed at step 420. The SEI thickness may be determined as follows:

$$L_{SEI}(t) = \frac{-1 + \sqrt{1 + At}}{B}$$

where A and B are as follows:

$$A = \frac{2\varepsilon_{SEI} C_{sol}^0 MW_{SEI} k_{SEI}^2}{\rho_{SEI} D_{sol}} \left\{ \exp\left[-\frac{\alpha F(OCV_{anode} - U_{SEI})}{RT}\right] \right\}^2, \text{ and}$$

$$B = \frac{k_{SEI}}{D_{sol}} \exp\left[-\frac{\alpha F(OCV_{anode} - U_{SEI})}{RT}\right].$$

In the above equations, $\varepsilon_{SEI}$, $C_{sol}^0$, $\Delta C_{sol}$ are the SEI porosity, the bulk solvent concentration and the solvent concentration difference between electrolyte bulk and particle surface, respectively. $OCV_{anode}$ and $U_{SEI}$ are the anode open circuit potential and the equilibrium potential of the solvent reduction reaction (i.e. minimum potential at which electrolyte is stable), respectively. The parameters $k_{SEI}$ and $D_{sol}$ are the reaction constant and solvent diffusivity in the SEI layer, respectively. These temperature dependent properties are the fitting parameters required since all the other properties including $U_{SEI}$ and $\varepsilon_{SEI}$ are correlated with $k_{SEI}$ and $D_{sol}$, and where $MW_{SEI}$ and $\rho_{SEI}$ are the molecular weight and density of SEI, both physics-based properties.

An anode surface area may be accessed at step 430. The cell capacity drop is then determined for the current time at step 440. The cell capacity drop at a current time may be determined as:

$$\Delta Cap(t) = \frac{A_{anode} \rho_{SEI} n_{Li^+}^A F}{MW_{SEI}} L_{SEI}(t) - n_{Li^+}^C F \Delta c_{Li_2CO_3},$$

wherein $A_{anode}$ is the anode surface area. $n_{Li^+}^A$ and $n_{Li^+}^C$ are the Li$^+$ stoichiometry coefficient in anode and cathode parasitic reactions, respectively.

$\Delta c_{Li_2CO_3}$ is the concentration change of Lithium Carbonate in the cathode side reaction, determined as follows:

$$\Delta c_{Li_2CO_3} = c_{Li_2CO_3}^0 \left[ 1 - \exp\left(-\frac{k_{cathode}}{c_{Li_2CO_3}^0} \exp\left(\frac{\alpha F}{RT}(OCV_{cathode} - U_{side}^{cathode})\right) A_{cathode} t\right) \right]$$

wherein $c_{Li_2CO_3}^0$ is the initial concentration of Lithium Carbonate residual in cathode. The fitting parameter $k_{cathode}$ is the cathode side reaction constant which increases exponentially with temperature. $OCV_{cathode}$ and $U_{side}^{cathode}$ are the cathode open circuit potential and the equilibrium potential of the cathode side reaction (i.e., maximum potential at which the electrolyte is stable), respectively. $A_{cathode}$ is the cathode surface area.

Figure 5:
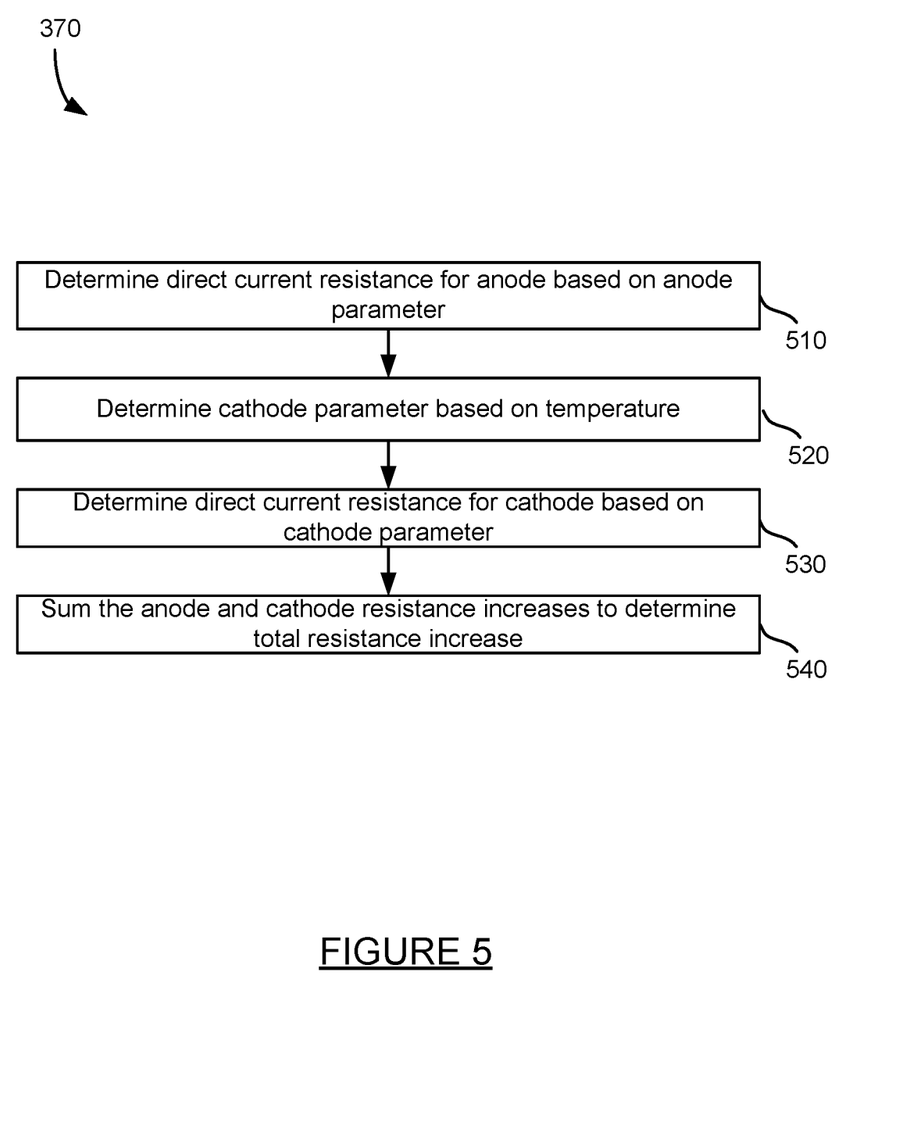
FIG. 5 is an exemplary method for calculating a resistance rise.

FIG. 5 is an exemplary method for calculating a resistance rise. The method of FIG. 5 provides more detail for step 370 the method of FIG. 3. A direct-current resistance for the anode is determined based on the anode parameter at step 510. The direct-current resistance can be determined as:

$$\Delta DCR_{anode} = \beta_{anode} L_{SEI}(t).$$

A cathode parameter $k_{cathde}$ is determined based on the temperature at step 520. A direct-current resistance for the cathode is then determined based on the cathode parameter at step 530. The direct-current resistance for the cathode can be determined as:

$$\Delta DCR_{cathode} = \beta_{cathode} \Delta c_{Li_2CO_3},$$

$\beta_{anode}$ and $\beta_{cathode}$ are the scaling factors to convert the SEI thickness and Lithium Carbonate concentration to the direct-current resistance, respectively. The anode resistance and the cathode resistance increases are summed to determine the total resistance increase at step 540. The total resistance can be calculated as follows:

$$\Delta DCR = \Delta DCR_{anode} + \Delta DCR_{cathode}.$$

Figure 6:
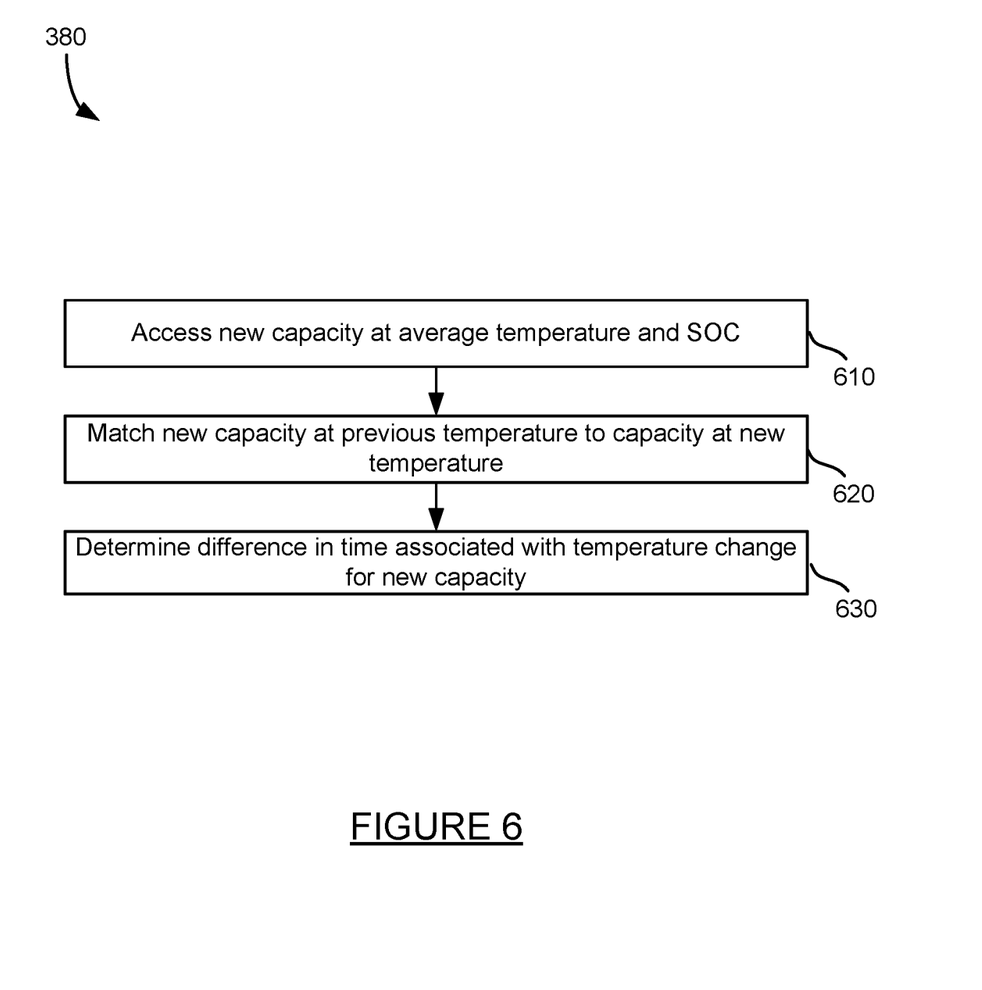
FIG. 6 is an exemplary method for determining a new time during a calendar fade determination.

FIG. 6 is an exemplary method for determining a new time during a calendar fade. The new capacity is accessed at the average temperature and state of charge at step 610. The new capacity at the previous temperature is matched to a capacity of the new temperature at step 620. The difference in time associated with the temperature changes in determined for the new capacity at step 630.

Figure 7:
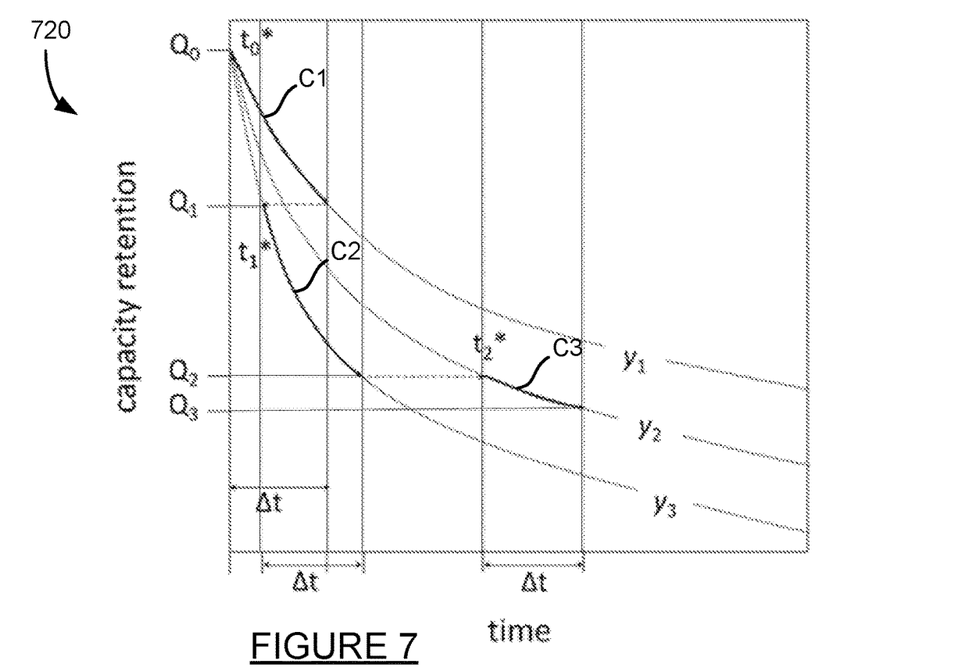
FIGS. 7-8 are plots illustrating a capacity retention over time.
Figure 8:
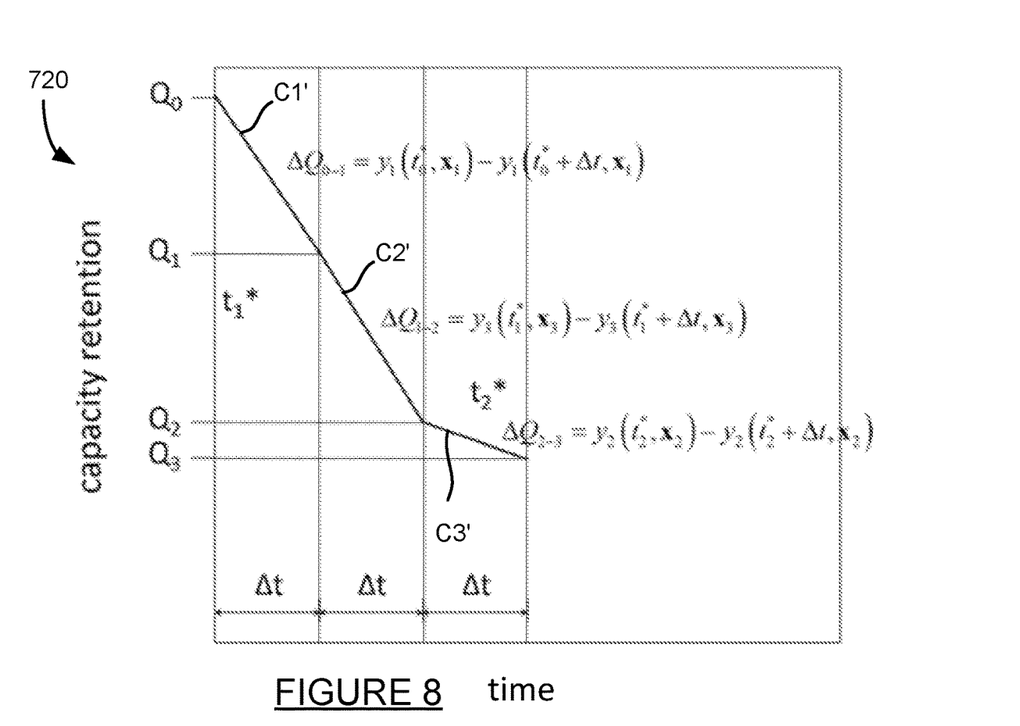

FIGS. 7-8 are plots illustrating a capacity retention over time. The plot of FIG. 7 illustrates capacity retention $y_1$, $y_2$, and $y_3$, wherein each of $y_1$, $y_2$, and $y_3$ are associated with a different temperature. In some instances, the temperature of y1 is less than the temperature associated with y2, and the temperature of y2 is less than the temperature associated with y3.

A capacity retention (Q) is plotted at times $T_0$, $T_1$, $T_2$, and $T_3$. Between $T_0$ and $T_1$, the cell has a temperature associated with plot $y_1$. Hence, the capacity retention between $T_0$ and $T_1$ is along a portion $C_1$ of $y_1$. At time $T_1$, the temperature of the cell is detected to be the temperature associated with $y_3$. As such, the capacity retention at time T2 is shifted to the plot of y3 at capacity $Q_1$, and the capacity retention continues along plot segment $C_2$. At time $T_2$, the temperature of the cell is determined to be that associated with plot $y_2$. As such, the capacity retention is shifted towards segment $C_3$.

The plot of FIG. 8 illustrates the capacity retention associated with the capacity segments of FIG. 7. Hence, segments $C_1'$ associated with segments $C_1$ of FIG. 7, $C_2'$ of FIG. 8 is associated with $C_2$ of FIG. 7, and $C_3'$ is associated with segment $C_3$ of FIG. 7. Additionally, $C_1'$ is associated with the capacity retention Q0 the $Q_1$ between $T_0$ and $T_1$, $C_2'$ is between $Q_1$ and $Q_2$ between times $T_1$ and $T_2$, and $C_3'$ is between $Q_2$ and $Q_3$ between $T_2$ and $T_3$.

Figure 9:
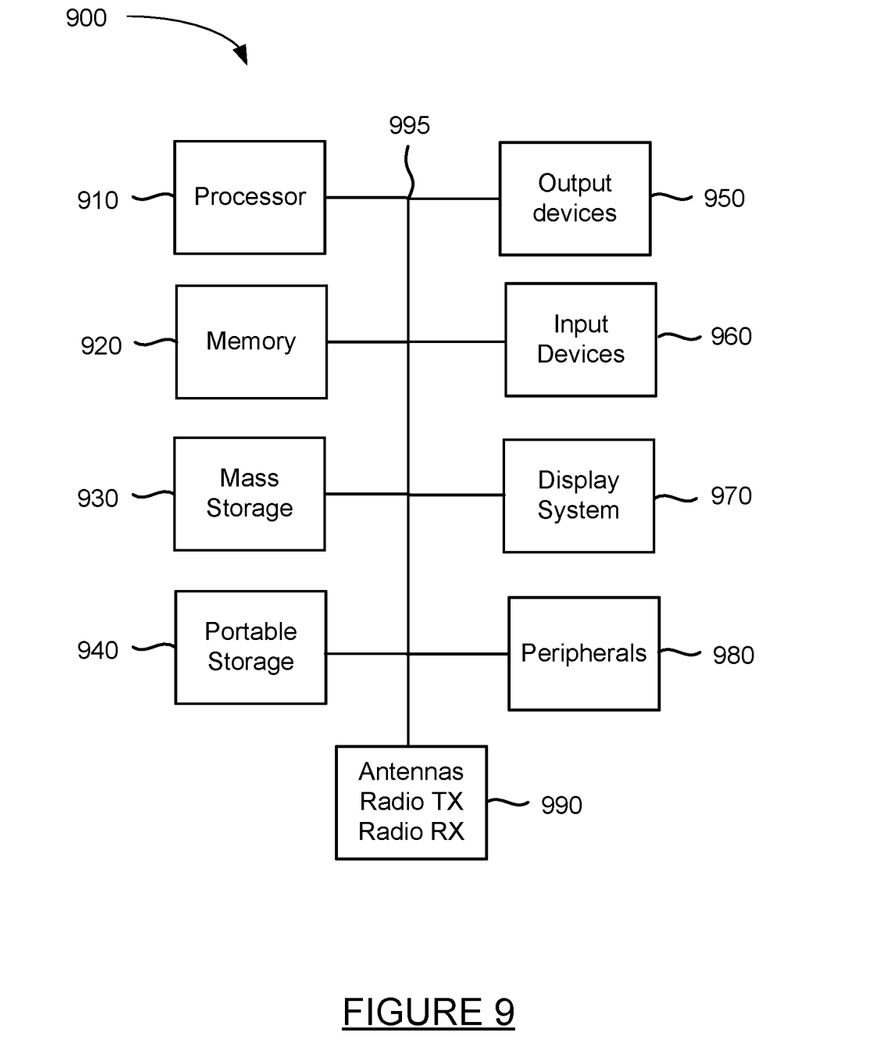
FIG. 9 illustrates a computing environment for use with the present technology.

FIG. 9 is a block diagram of a computing environment for implementing in the present technology. System 900 of FIG. 9 may be implemented in the contexts of the likes of machines that implement battery management system 110. The computing system 900 of FIG. 9 includes one or more processors 910 and memory 920. Main memory 920 stores, in part, instructions and data for execution by processor 910. Main memory 920 can store the executable code when in operation. The system 900 of FIG. 9 further includes a mass storage device 930, portable storage medium drive(s) 940, output devices 950, user input devices 960, a graphics display 970, and peripheral devices 980.

The components shown in FIG. 9 are depicted as being connected via a single bus 990. However, the components may be connected through one or more data transport means. For example, processor unit 910 and main memory 920 may be connected via a local microprocessor bus, and the mass storage device 930, peripheral device(s) 980, portable storage device 940, and display system 970 may be connected via one or more input/output (I/O) buses.

Mass storage device 930, which may be implemented with a magnetic disk drive, an optical disk drive, a flash drive, or other device, is a non-volatile storage device for storing data and instructions for use by processor unit 910. Mass storage device 930 can store the system software for implementing embodiments of the present invention for purposes of loading that software into main memory 920.

Portable storage device 940 operates in conjunction with a portable non-volatile storage medium, such as a floppy disk, compact disk or Digital video disc, USB drive, memory card or stick, or other portable or removable memory, to input and output data and code to and from the computer system 900 of FIG. 9. The system software for implementing embodiments of the present invention may be stored on such a portable medium and input to the computer system 900 via the portable storage device 940.

Input devices 960 provide a portion of a user interface. Input devices 960 may include an alpha-numeric keypad, such as a keyboard, for inputting alpha-numeric and other information, a pointing device such as a mouse, a trackball, stylus, cursor direction keys, microphone, touchscreen, accelerometer, and other input devices. Additionally, the system 900 as shown in FIG. 9 includes output devices 950. Examples of suitable output devices include speakers, printers, network interfaces, and monitors.

Display system 970 may include a liquid crystal display (LCD) or other suitable display device. Display system 970 receives textual and graphical information and processes the information for output to the display device. Display system 970 may also receive input as a touchscreen.

Peripherals 980 may include any type of computer support device to add additional functionality to the computer system. For example, peripheral device(s) 980 may include a modem or a router, printer, and other device.

The system of 900 may also include, in some implementations, antennas, radio transmitters and radio receivers 990. The antennas and radios may be implemented in devices such as smart phones, tablets, and other devices that may communicate wirelessly. The one or more antennas may operate at one or more radio frequencies suitable to send and receive data over cellular networks, Wi-Fi networks, commercial device networks such as a Bluetooth device, and other radio frequency networks. The devices may include one or more radio transmitters and receivers for processing signals sent and received using the antennas.

The components contained in the computer system 900 of FIG. 9 are those typically found in computer systems that may be suitable for use with embodiments of the present invention and are intended to represent a broad category of such computer components that are well known in the art. Thus, the computer system 900 of FIG. 9 can be a personal computer, handheld computing device, smart phone, mobile computing device, workstation, server, minicomputer, mainframe computer, or any other computing device. The computer can also include different bus configurations, networked platforms, multi-processor platforms, etc. Various operating systems can be used including Unix, Linux, Windows, Macintosh OS, Android, as well as languages including Java, .NET, C, C++, Node.JS, and other suitable languages.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

The invention claimed is:

1. A non-transitory computer readable storage medium having embodied thereon a program, the program being executable by a processor to perform a method for determining a calendar model for a battery cell, comprising:
 accessing an initial charge capacity and resistance at a first time by a battery management system for the battery cell;
 determining a first temperature and a first state of charge for the battery cell at the first time;
 determining a second temperature and a second state of charge for the battery cell at a second time;
 based on a change in temperature between the first temperature and the second temperature for the battery cell or a change in state of charge between the first state of charge and the second state of charge for the battery cell, determining a capacity drop for the battery cell based on the second temperature and at least one first physics-based property of the battery cell at the second time:

determining a resistance growth for the battery cell based on the second temperature and at least one second physics-based property of the battery cell at the second time; and determining a calendar fade time based on the capacity drop and the resistance growth.

2. The non-transitory computer readable storage medium of claim 1, wherein the at least one first physics-based property comprises molecular weight and solid electrolyte interphase density.

3. The non-transitory computer readable storage medium of claim 1, wherein the at least one second physics-based property comprises solid electrolyte interphase thickness.

4. The non-transitory computer readable storage medium of claim 1, wherein the change in temperature between the first temperature and the second temperature is greater than a threshold temperature change.

5. The non-transitory computer readable storage medium of claim 1, wherein the change in state of charge between the first state of charge and the second state of charge is greater than a threshold state of charge change.

6. The non-transitory computer readable storage medium of claim 1, wherein determining the capacity drop comprises determining a thickness of a solid electrolyte interphase layer for the battery cell.

7. The non-transitory computer readable storage medium of claim 1, wherein determining the resistance growth comprises determining a direct current resistance for an anode of the battery cell and a direct current resistance for a cathode of the battery cell.

8. A system for determining a calendar model for a battery cell, comprising:
one or more processors,
memory, and
a battery management system stored in the memory and executable by the one or more processors to:
access an initial charge capacity and resistance at a first time by the battery management system for the battery cell
determine a first temperature and a first state of charge for the battery cell at the first time,
determine a second temperature and a second state of charge for the battery cell at a second time,
based on a change in temperature between the first temperature and the second temperature for the battery cell or a change in state of charge between the first state of charge and the second state of charge for the battery cell, determine a capacity drop for the battery cell based on the second temperature and at least one first physics-based property of the battery cell at the second time,
determine a resistance growth for the battery cell based on the second temperature and at least one second physics-based property of the battery cell at the second time, and
determine a calendar fade time based on the capacity drop and the resistance growth.

9. The system of claim 8, wherein the at least one first physics-based property comprises molecular weight and solid electrolyte interphase density.

10. The system of claim 8, wherein the at least one second physics-based property comprises solid electrolyte interphase thickness.

11. The system of claim 8, wherein the change in temperature between the first temperature and the second temperature is greater than a threshold temperature change.

12. The system of claim 8, wherein the change in state of charge between the first state of charge and the second state of charge is greater than a threshold state of charge change.

13. The system of claim 8, wherein the determining the capacity drop comprises determining a thickness of a solid electrolyte interphase layer for the battery cell, and determining the resistance growth comprises determining a direct current resistance for an anode of the battery cell and a direct current resistance for a cathode of the battery cell.

14. A method for determining a calendar model for a battery cell, comprising:
accessing an initial charge capacity and resistance at a first time;
determining a first temperature and a first state of charge for the battery cell at the first time;
determining a second temperature and a second state of charge for the battery cell at a second time;
based on a change in temperature between the first temperature and the second temperature for the battery cell or a change in state of charge between the first state of charge and the second state of charge for the battery cell, determining a capacity drop for the battery cell based on the second temperature and at least one first physics-based property of the battery cell at the second time;
determining a resistance growth for the battery cell based on the second temperature and at least one second physics-based property of the battery cell at the second time; and
determining a calendar fade time based on the capacity drop and the resistance growth.

15. The method of claim 14, wherein the at least one first physics-based property comprises molecular weight and solid electrolyte interphase density.

16. The method of claim 14, wherein the at least one second physics-based property comprises solid electrolyte interphase thickness.

17. The method of claim 14, wherein the change in temperature between the first temperature and the second temperature is greater than a threshold temperature change.

18. The method of claim 14, wherein the change in state of charge between the first state of charge and the second state of charge is greater than a threshold state of charge change.

19. The method of claim 14, wherein determining the capacity drop comprises determining a thickness of a solid electrolyte interphase layer for the battery cell.

20. The method of claim 14, wherein determining the resistance growth comprises determining a direct current resistance for an anode of the battery cell and a direct current resistance for a cathode of the battery cell.

* * * * *